United States Patent
Wang et al.

(10) Patent No.: US 11,309,365 B2
(45) Date of Patent: Apr. 19, 2022

(54) OPTICAL FINGERPRINT SENSOR AND DISPLAY MODULE

(71) Applicant: BOE TECHNOLOGY GROUP CO., LTD., Beijing (CN)

(72) Inventors: Yawei Wang, Beijing (CN); Haisheng Wang, Beijing (CN); Lei Wang, Beijing (CN); Lin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 47 days.

(21) Appl. No.: 16/901,882

(22) Filed: Jun. 15, 2020

(65) Prior Publication Data

US 2021/0193752 A1    Jun. 24, 2021

(30) Foreign Application Priority Data

Dec. 18, 2019  (CN) .......................... 201922279723.0

(51) Int. Cl.
*G06F 3/041* (2006.01)
*H01L 27/32* (2006.01)
*G06V 40/13* (2022.01)

(52) U.S. Cl.
CPC ...... *H01L 27/3227* (2013.01); *G06V 40/1318* (2022.01); *H01L 27/3262* (2013.01)

(58) Field of Classification Search
USPC ........................................ 345/173, 156, 174
See application file for complete search history.

(56) References Cited

U.S. PATENT DOCUMENTS

| | | | | |
|---|---|---|---|---|
| 2004/0252867 | A1* | 12/2004 | Lan ...................... | G06K 9/0004 |
| | | | | 382/124 |
| 2016/0224819 | A1* | 8/2016 | Kim ...................... | G06K 9/0004 |
| 2018/0225501 | A1* | 8/2018 | Mienko .................. | H01L 51/56 |
| 2019/0012507 | A1* | 1/2019 | Dattalo ................ | G06K 9/0004 |
| 2019/0114030 | A1* | 4/2019 | Shen ..................... | G06F 3/0446 |
| 2019/0272407 | A1* | 9/2019 | Park ...................... | H01L 51/529 |
| 2019/0278967 | A1* | 9/2019 | Shepelev ................. | G09G 3/32 |
| 2019/0294851 | A1* | 9/2019 | Chung ................ | H01L 51/5281 |
| 2020/0144334 | A1* | 5/2020 | Jang .................... | G06V 40/1318 |
| 2020/0259024 | A1* | 8/2020 | Huang ................ | H01L 27/3227 |
| 2020/0279090 | A1* | 9/2020 | He ....................... | G06K 9/00087 |
| 2020/0302141 | A1* | 9/2020 | Heo ........................ | H01L 29/786 |
| 2020/0349332 | A1* | 11/2020 | Lillie ....................... | G06F 3/042 |
| 2020/0350375 | A1* | 11/2020 | Zhu ...................... | H01L 27/3234 |
| 2020/0409191 | A1* | 12/2020 | He ......................... | G02F 1/1335 |
| 2021/0089747 | A1* | 3/2021 | He ...................... | G06K 9/00046 |
| 2021/0117522 | A1* | 4/2021 | He ..................... | G06K 9/00087 |

* cited by examiner

*Primary Examiner* — Thuy N Pardo
(74) *Attorney, Agent, or Firm* — Brooks Kushman P.C.

(57) ABSTRACT

The present disclosure provides an optical fingerprint sensor and a display module. The optical fingerprint sensor includes a photodiode and a switching thin film transistor connected to the photodiode, in which the photodiode includes a first electrode made of a light-absorbing conductive nano-material; the first electrode is located in a same layer as a second electrode of the switching thin film transistor, and the first electrode includes a light-entering end surface facing a light-entering side and a side surface connected to the light-entering end surface, the side surface includes a curved portion, and the second electrode is at least connected to the curved portion.

17 Claims, 4 Drawing Sheets

OPTICAL FINGERPRINT SENSOR AND DISPLAY MODULE

CROSS-REFERENCE TO RELATED APPLICATION

This application claims priority to Chinese Patent Application No. 201922279723.0 filed on Dec. 18, 2019, which is incorporated herein by reference in its entirety.

TECHNICAL FIELD

The present disclosure relates to the technical field of fingerprint detection, in particular, to an optical fingerprint sensor and a display module.

BACKGROUND

The traditional optical fingerprint sensor usually uses a Si:H diode as the photosensitive unit for photoelectric conversion. The lower electrode of the photosensitive diode is connected to the source of the thin film transistor TFT to control the turn-on and turn-off of reading the electrical signal generated by the light signal induced by the photodiode.

As for the optical fingerprint sensor in the related art, in order to ensure the conductivity of the lower electrode of the photodiode, the lower electrode is usually made of a metal conductive material, but there is an optical signal transmitted to the diode that cannot be completely absorbed and converted into a current signal, and thus a part of the light will be emitted by the diode, thereby causing the problem that the current signal converted by the optical fingerprint sensor is inaccurate.

SUMMARY

An embodiment of the present disclosure provides an optical fingerprint sensor, including a photodiode and a switching thin film transistor connected to the photodiode, in which the photodiode includes a first electrode made of a light-absorbing conductive nano-material; and in which the first electrode is located in a same layer as a second electrode of the switching thin film transistor, and the first electrode includes a light-entering end surface facing a light-entering side and a side surface connected to the light-entering end surface, the side surface includes a curved portion, and the second electrode is at least connected to the curved portion.

In one example, the second electrode is a source electrode or a drain electrode of the switching thin film transistor, and the first electrode is an electrode of the photodiode away from the light-entering side.

In one example, the second electrode is arranged to fully surround the first electrode and be connected to each position of the side surface.

In one example, the light-entering end surface is formed into a circular shape, and the curved portion is an entire side surface of the first electrode.

In one example, the second electrode includes a top surface facing the light-entering side, the top surface is located in a same plane as the light-entering end surface, and the top surface and the light-entering end surface are combined to form a preset pattern.

Further, the light-entering end surface is formed into a first pattern including a curved portion, and a portion of the top surface connected to the light-entering end surface is formed into a second pattern; and the first pattern and the second pattern are combined to form a quadrilateral.

Further, the first pattern of the light-entering end surface is an inverted "F" shape, the second pattern of the portion of the top surface connected to the light-entering end surface is an upright "F" shape, and the first pattern and the second pattern are spliced at the curved portion and combined to form a quadrilateral.

In one example, the light-absorbing conductive nano-material is an iron oxide nano-material doped with a conductive metal.

Further, the conductive metal includes, but is not limited to, one or more of titanium, platinum, molybdenum, chromium, and tin.

In one example, a drain electrode and a source electrode of the switching thin film transistor are made of any one of molybdenum, aluminum, chromium, gold, titanium, nickel, neodymium, copper, and an alloy thereof.

In one example, the second electrode is a source electrode of the switching thin film transistor, and the first electrode is a lower electrode of the photodiode.

In one example, the photodiode further includes: a PIN diode and a transparent electrode sequentially prepared on the light-entering end surface of the first electrode; and a third electrode connected to the transparent electrode.

In one example, the second electrode is a source electrode of the switching thin film transistor, and the first electrode is a lower electrode of the photodiode, and in which the switching thin film transistor further includes a gate electrode, a drain electrode, and an active layer.

An embodiment of the present disclosure also provides a display module, including the optical fingerprint sensor as described in any one of the above.

In one example, the display module further includes an organic light emitting diode (OLED) display panel; and a plurality of optical fingerprint sensors is arranged on a side of the OLED display panel away from the light-entering side and distributed in an array.

In one example, the plurality of the optical fingerprint sensors is assembled on an optical path collimating substrate, and the optical path collimating substrate is attached to the OLED display panel.

In one example, the display module further includes an organic light emitting diode (OLED) display panel, and the OLED display panel includes a plurality of OLED pixel units; and a plurality of optical fingerprint sensors is distributed in an array among the plurality of OLED pixel units.

In one example, the second electrode and the first electrode are arranged in a same layer as the source electrode and the drain electrode of the thin film transistor of the OLED pixel unit; and a gate electrode of the switching thin film transistor is arranged in a same layer as a gate electrode of a thin film transistor of the OLED pixel unit.

DETAILED DESCRIPTION

The technical problems, the technical solutions, and the advantages of the present invention will be more clearly described in combination with the drawings and specific embodiments.

In order to ensure that in the optical fingerprint sensor, the photodiode not only has better light absorption rate, but also has better conductivity with the switching thin film transistor, the present disclosure provides an optical fingerprint sensor. The efficiency of the light absorption can be improved by preparing the first electrode of the photodiode with a light-absorbing conductive nano-material. Moreover, the side surface of the first electrode includes a curved portion, the second electrode of the switching thin film transistor is at least connected to the curved portion of the photodiode when the second electrode is connected to the first electrode, thereby achieving the purpose of increasing the contact area between the first electrode and the second electrode and ensuring a better electrical conductivity between the first electrode and the second electrode.

Figure 1:
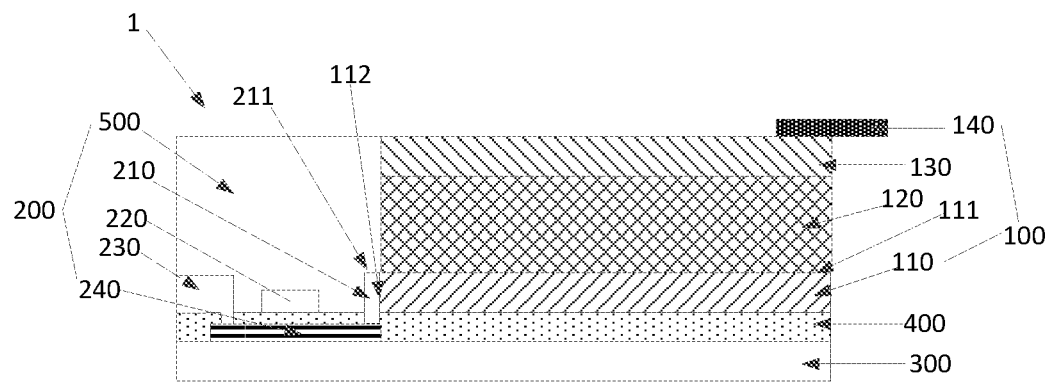
FIG. 1 is a schematic view showing an optical fingerprint sensor according to an embodiment of the present disclosure.

Specifically, in an embodiment of the optical fingerprint sensor according to the present disclosure, as shown in FIG. 1, the optical fingerprint sensor 1 includes a photodiode 100 and a switching thin film transistor 200 connected to the photodiode 100.

The photodiode 100 includes a first electrode 110 made of a light-absorbing conductive nano-material; and the switching thin film transistor 200 includes a second electrode 210 located in the same layer as the first electrode 110.

In one example, the second electrode 210 is one of the source electrode and drain electrode of the switching thin film transistor 200, and the first electrode 110 is an electrode of the photodiode 100 away from the light-entering side.

In an embodiment of the present disclosure, taking the second electrode 210 used as the source electrode of the switching thin film transistor 200 as an example, the specific structure of the optical fingerprint sensor of the present disclosure will be described in detail.

Specifically, as shown in FIG. 1, the switching thin film transistor 200 further includes a gate electrode 220, a drain electrode 230 and an active layer 240. The active layer 240 is prepared on the glass substrate 300, and the active layer 240 is covered with an insulating layer 400. The drain electrode 230, the source electrode (second electrode 210), and the gate electrode 220 are all prepared on the insulating layer 400, and the drain electrode 230 and the second electrode 210 are in contact with the active layer 240 through via holes in the insulating layer 400, respectively.

The first electrode 110 of the photodiode 100 is prepared on the insulating layer 400, and the photodiode 100 further includes a PIN diode 120 prepared on the first electrode 110, an indium tin oxide (ITO) transparent electrode 130 prepared on the PIN diode 120, and a third electrode 140 connected to the ITO transparent electrode 130.

Further, a planarization layer 500 is prepared on the drain electrode 230, the source electrode (second electrode 210) and the gate electrode 220.

Based on the photodiode 100 and the switching thin film transistor 200 of the above implementation structure, the source electrode or the drain electrode (second electrode 210) of the switching thin film transistor 200 are arranged in a same layer as the first electrode 110 of the photodiode 100 and is electrically connected thereto. In the optical fingerprint sensor of the above implementation structure, the third electrode 140 of the photodiode 100 is externally biased, incident light can be incident on the PIN diode 120 through the ITO transparent electrode 130, and the PIN diode 120 is capable of converting the optical signal of incident light into an electrical signal by using the voltage difference between the third electrode 140 and the first electrode 110. In addition, the turn-on and turn-off of reading the electrical signal output of the photodiode 100 can be controlled by controlling the state of the switching thin film transistor 200.

It should be noted that the PIN diode 120 generally includes a first semiconductor layer, a second semiconductor layer, and a functional layer located between the first semiconductor layer and the second semiconductor layer, and the functional layer has photoelectric sensing characteristics, which is capable of converting the incident light signal into an electrical signal. A person skilled in the art should be able to understand the specific structure of the PIN diode 120, and the structure of the PIN diode 120 is not the research focus of the present disclosure, and will not be described in detail here.

In an embodiment of the present disclosure, the drain electrode 230 and the source electrode (second electrode 210) of the switching thin film transistor 200 may be made of any one of molybdenum (Mo), aluminum (Al), chromium (Cr), gold (Au), titanium (Ti), nickel (Ni), neodymium (Nd), copper (Cu), and an alloy thereof.

In an embodiment of the present disclosure, the first electrode 110 of the photodiode 100 is made of a light-absorbing conductive nano-material. The light-absorbing conductive nano-material is used to prevent the incident light-entering on the photodiode 100 from being reflected and exiting from the photodiode 100, thereby achieving the effect of improving the light absorption rate of the photodiode 100.

In one example, the light-absorbing conductive nano-material is an iron oxide nano-material doped with a conductive metal. Iron oxide, also known as ferric oxide ($Fe_2O_3$), has photosensitivity and can absorb photons to make electronic transitions, thereby achieving the conversion of optical signals into electrical signals. In addition, the absorption band gap of the iron oxide nanomaterials is the wavelength range of visible light, and it has a high degree of coincidence with the light absorption spectrum of the PIN diode 120 in the photodiode 100. Therefore, iron oxide can be used as the lower electrode of the diode. At the same time of acting as a conductive electrode, it can also absorb light that is not absorbed by the PIN diode 120 to enhance the light absorption characteristics of the photodiode 100, thereby further improving the accuracy of fingerprint recognition.

Further, the iron oxide nano-material is also doped with a conductive metal to achieve the effect of improving conductivity. For example, the doped conductive metal includes, but is not limited to, titanium, platinum, molybdenum, chromium, tin, etc.

Specifically, when the first electrode 110 is prepared with the above material, the iron oxide nano-material may be synthesized by a colloidal chemical method, and then the conductive metal is doped by ion implantation or diffusion.

The experiment proves that using the optical fingerprint sensor in related art, the light that cannot be absorbed by the photodiode accounts for about 20% of the incident light. In an embodiment of the present disclosure, the light absorption rate of the photodiode can be effectively improved by preparing the first electrode 110 with a light-absorbing conductive nano-material.

Figure 2:
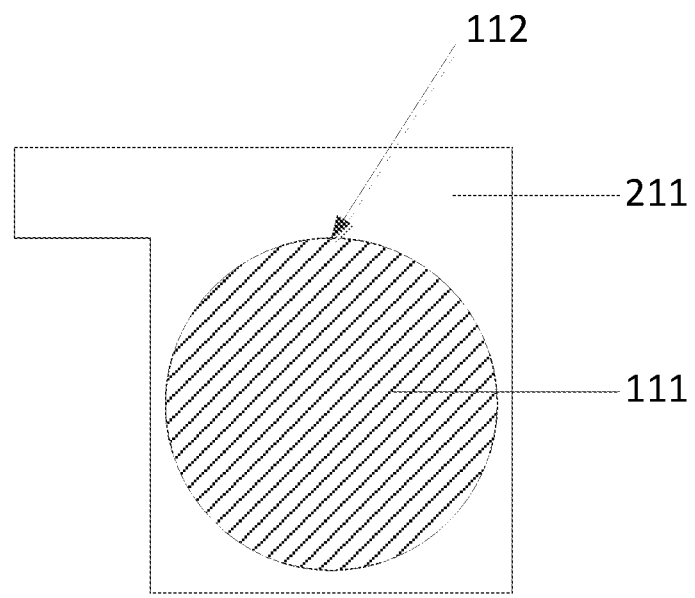
FIG. 2 is a first schematic view showing a first electrode and a second electrode of the optical fingerprint sensor according to an embodiment of the present disclosure.
Figure 3:
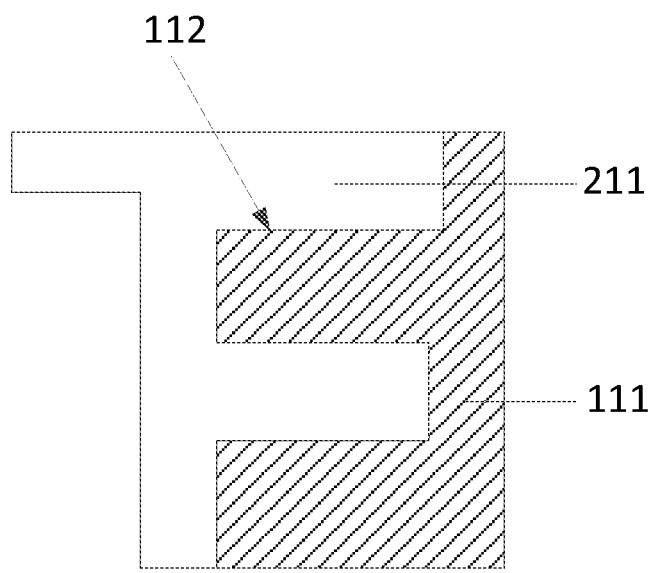
FIG. 3 is a second schematic view showing a first electrode and a second electrode of the optical fingerprint sensor according to an embodiment of the present disclosure.

Further, in the optical fingerprint sensor according to an embodiment of the present disclosure, as shown in FIGS. 1 to 3, the first electrode 110 of the photodiode 100 includes a light-entering end surface 111 facing the light-entering side and a side surface 112 connected to the light-entering end surface 111; and the side surface 112 includes a curved portion, and the second electrode 210 arranged in the same layer is at least connected to the curved portion of the first electrode 110. As compared with the conventional plane-to-plane connection between the electrodes, the implementation structure can increase the contact area between the first electrode 110 and the second electrode 210, thereby being capable of further increasing the conductivity between the first electrode 110 and the second electrode 210.

In one embodiment, the second electrode 210 arranged in the same layer fully surrounds the first electrode 110, and is connected to each position of the side surface 112 of the first electrode 110. Based on this arrangement structure, the first electrode 110 is formed into a patterned form so as to increase the contact area between the first electrode 110 and the second electrode 210, thereby ensuring that the conductivity is improved. In addition, as compared with the related art, the patterned first electrode 110 can also increase the light receiving area so as to further improve the light absorption rate of the photodiode 100.

Specifically, it can be understood that the first electrode 110 and the second electrode 210 have a layered structure, and the patterning of the first electrode 110 is the patterning of the light-entering end surface 111 of the first electrode 110. Further, since the first electrode 110 is arranged in a same layer as the second electrode 210, the side surface of the second electrode 210 is connected to the side surface of the first electrode 110. The second electrode 210 includes a top surface 211 facing the light-entering side and is located on a same plane as the light-entering end surface 111, and the top surface 211 is also patterned. In one embodiment, as shown in FIG. 2, the light-entering end surface 111 of the first electrode 110 is formed into a circular shape, and the entire side surface 112 of the first electrode 110 is formed into a curved portion.

In another embodiment, the light-entering end surface 111 of the first electrode 110 and the top surface 211 of the second electrode 210 are combined to form a predetermined pattern. Optionally, the preset pattern may be any one of regular shapes, such as triangle, quadrilateral, and hexagon.

Optionally, the light-entering end surface 111 is formed into a first pattern including a curved portion, and the portion of the top surface 211 connected to the light-entering end surface 111 is formed into a second pattern; and the first pattern and the second pattern are combined to form a quadrilateral.

For example, as shown in FIG. 3, the first pattern of the light-entering end surface 111 is an inverted "F" shape, the second pattern of the portion where the top surface 211 of the second electrode 210 is connected to the light-entering end surface 111 of the first electrode 110 is an upright "F" shape, and the first pattern and the second pattern are spliced at the curved portion and combined to form a quadrilateral. This arrangement structure may not only increase the contact area between the first electrode 110 and the second electrode 210, but also achieve the tightness of the contact between the first electrode 110 and the second electrode 210, thereby being capable of quickly exporting the photo-generated current on the photodiode 100.

It should be noted that in the embodiment of the present disclosure, the portion where the top surface 211 of the second electrode 210 is connected to the light-entering end surface 111 of the first electrode 110 is indicated as the main body portion of the second electrode 210, that is, except that the extended portion connected to the active layer 240 is formed into a main body portion, the main body portion of the second electrode 210 is spliced with the first electrode 110 and is capable of being combined with the first electrode 110 to form a quadrilateral.

Further, the specific shape of the patterned first electrode 110 described above is merely an example, and the specific shape is not limited thereto. According to the above detailed description of the first electrode 110, a person skilled in the art should be prepared into the first electrode 110 in various shapes, which will not be described here one by one.

In the optical fingerprint sensor according to an embodiment of the present disclosure, the first electrode is made of a light-absorbing conductive nano-material and the first electrode is patterned, the side surface includes a curved portion, the second electrode of the switching thin film transistor is connected to the first electrode of the photodiode, so that the prepared optical fingerprint sensor not only has a good light absorption rate, but also can ensure the conductivity between the photodiode and the switching thin film transistor to improve the accuracy of fingerprint recognition.

An embodiment of the present disclosure also provides a display module including the above-mentioned optical fingerprint sensor.

The display module according to an embodiment of the present disclosure performs photoelectric conversion by using the photodiode of the optical fingerprint sensor, thereby being capable of achieving the fingerprint detection.

Figure 4:
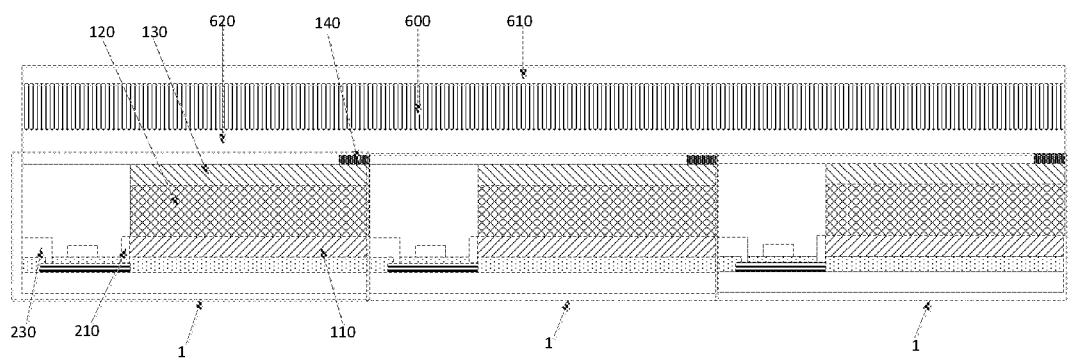
FIG. 4 is a schematic view showing an optical module according to an embodiment of the present disclosure.

In an embodiment of the display module according to an embodiment of the present disclosure, as shown in FIG. 4, the display module further includes an organic light emitting diode (OLED) display panel 600.

In the display module according to the embodiment of the present disclosure, the optical fingerprint sensor 1 is arranged on the opposite side of the light-entering side of the OLED display panel 600, thereby being capable of achieving the under-screen fingerprint recognition on the display panel. Specifically, on the transparent encapsulation substrate 610 on the light-entering side of the OLED display panel 600, when a finger touches the corresponding display area portion, the light emitted toward the transparent encapsulation substrate 610 of the OLED display panel 600 is reflected by the finger to the photodiode 100 of the optical fingerprint sensor 1, then the photodiode 100 photoelectrically converts the reflected light, and the concave-convex shape of the finger can be detected according to the magnitude of the obtained photo-generated current, thereby being capable of performing the under-screen fingerprint detection.

Figure 5:
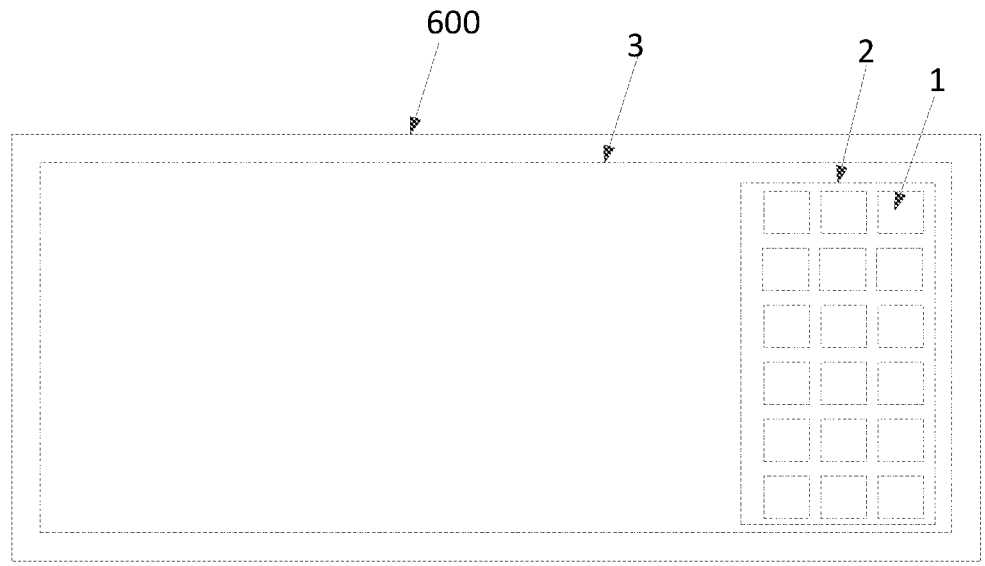
FIG. 5 is a first schematic view showing the relationship between the fingerprint detection area and the display area in the optical module according to an embodiment of the present disclosure.
Figure 6:
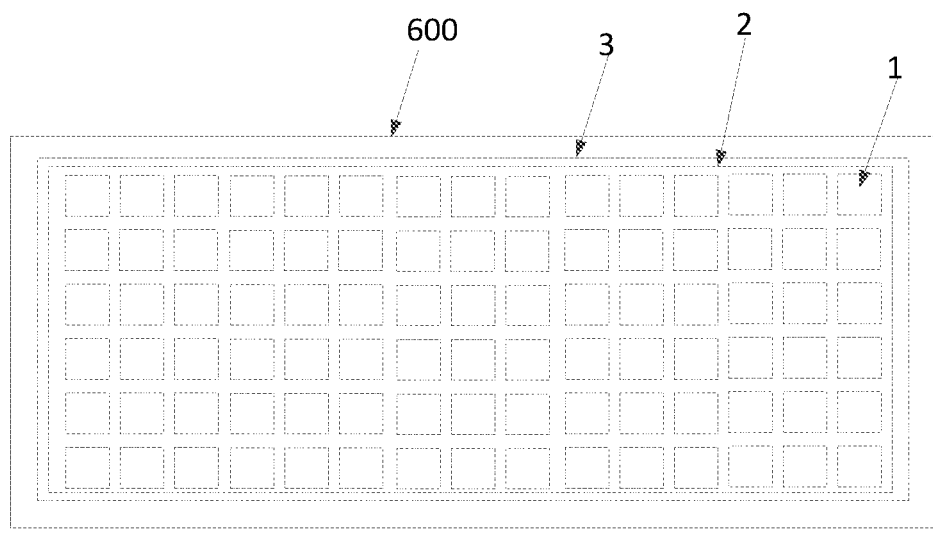
FIG. 6 is a second schematic view showing the relationship between the fingerprint detection area and the display area in the optical module according to an embodiment of the present disclosure.

As shown in FIG. 4, the optical fingerprint sensors 1 is plural, and a plurality of optical fingerprint sensors 1 is arranged on the opposite side of the light-entering side of the OLED display panel 600 and distributed in an array. Optionally, as shown in FIGS. 5 and 6, an orthogonal projection of the plurality of optical fingerprint sensors 1 distributed in an array on the display area 3 of the OLED display panel 600 forms a fingerprint detection area 2. Optionally, the fingerprint detection area 2 is located within the display area 3. In one embodiment, as shown in FIG. 5, the fingerprint detection area 2 belongs to a partial area of the display area 3, so that the display area 3 of the display module has a function of partial area fingerprint recognition.

Optionally, in another embodiment, as shown in FIG. 6, the fingerprint detection area 2 overlaps the display area 3, so that the entire display area 3 of the display module has a function of fingerprint recognition.

In an embodiment of the present disclosure, optionally, the plurality of optical fingerprint sensors 1 is assembled on an optical path collimating substrate 620, in which the optical path collimating substrate 620 is attached to the OLED display panel 600, and optionally, the material for preparing the optical path collimating substrate 620 includes, but are not limited to, optical fiber materials.

In addition, the plurality of optical fingerprint sensors 1 is fixedly connected to the optical path collimating substrate 620 respectively, and optionally, it can be fixed on the optical path collimating substrate 620 by bonding with optically clear adhesive (OCA).

A person skilled in the art should be able to understand the specific structure of the OLED display panel 600, which will not be described in detail here.

Figure 7:
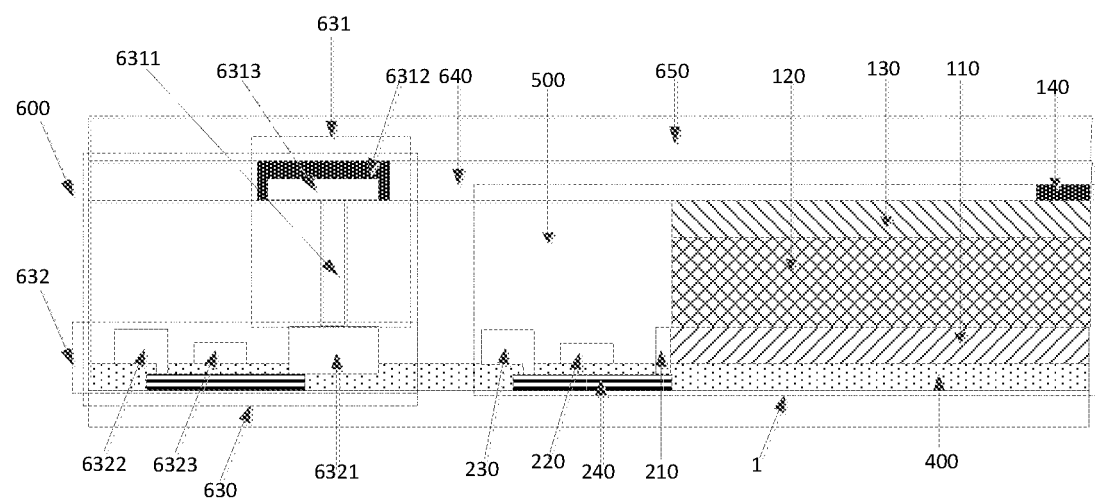
FIG. 7 is a schematic view showing an optical module according to another embodiment of the present disclosure.
Figure 8:
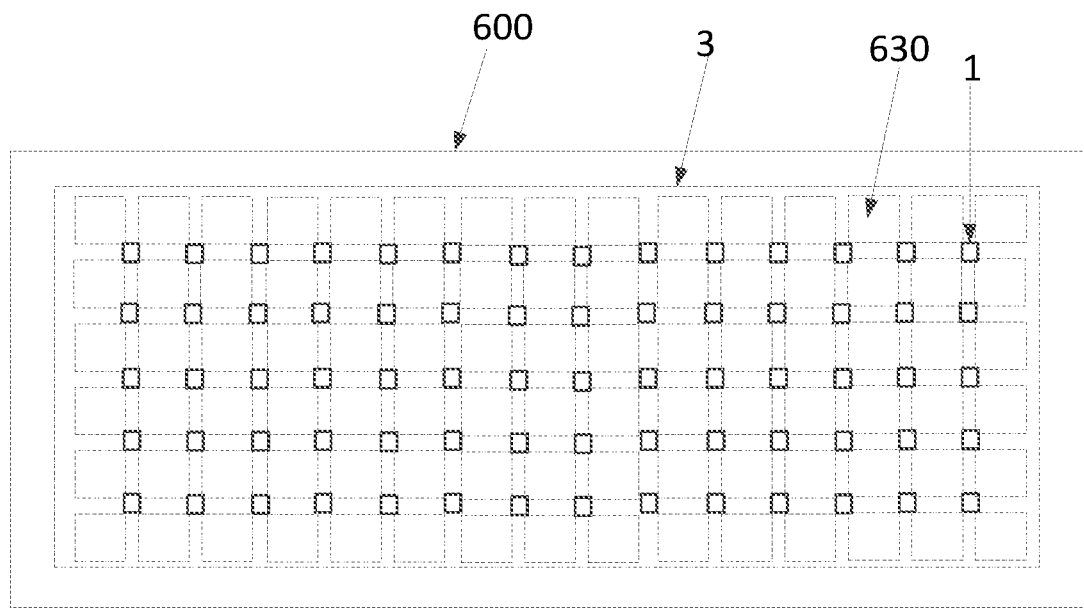
FIG. 8 is a schematic view showing the positional relationship between the OLED pixel unit and the optical fingerprint sensor in the optical module according to another embodiment of the present disclosure.

In another embodiment of the display module according to the embodiment of the present disclosure, as shown in FIGS. 7 and 8, the display module further includes an OLED display panel 600, and the OLED display panel 600 includes a plurality of OLED pixel units 630; and the fingerprint sensors 1 is plural, and the plurality of optical fingerprint sensors 1 is distributed in an array among the plurality of OLED pixel units 630, thereby being capable of achieving the on-screen fingerprint recognition of the display panel. Specifically, the plurality of optical fingerprint sensors 1 is arranged between the plurality of adjacent OLED pixel units 630, in which the distribution density of the optical fingerprint sensors 1 in the OLED display panels 600 may be determined according to the design requirement of the specific fingerprint identification.

It can be understood that, as shown in FIG. 7, the OLED pixel unit 630 includes an OLED light emitting unit 631 and a thin film transistor 632 for driving the OLED light emitting unit 631 to emit light. The OLED light emitting unit 631 includes a cathode 6311, an anode 6312, and an OLED organic functional layer 6313. The cathode 6311 is connected to the source electrode 6321 of the thin film transistor 632.

Further, the first electrode 110 of the optical fingerprint sensor 1 is arranged in the same layer as the source electrode 6321 and the drain electrode 6322 of the thin film transistor 632 of the OLED pixel unit 630; and the gate electrode 220 of the switching thin film transistor 200 is arranged in the same layer as the gate electrode 6323 of the thin film transistor 632 of the OLED pixel unit 630.

In addition, in the embodiment of the present disclosure, the OLED display panel 600 further includes a resin layer 640 for planarization and support, and is prepared on the thin film transistor 632 and the planarization layer 500 of the switching thin film transistor 200. Optionally, the OLED organic functional layer 6313 and the anode 6312 of the OLED light emitting unit 631 are sequentially prepared on the planarization layer 500 and arranged in the resin layer 640; and the third electrode 140 of the optical fingerprint sensor 1 is prepared on the ITO transparent electrode 130, and arranged in the resin layer 640.

Optionally, the display module further includes an encapsulation layer 650 located above the resin layer 640. Optionally, the encapsulation layer 650 includes a polarizer and an encapsulation cover plate.

In an embodiment of the present disclosure, optionally, as shown in FIG. 8, a plurality of optical fingerprint sensors 1 is evenly distributed in the entire display area of the OLED display panel 600, so that the entire display area of the display module has a function of fingerprint recognition. Of course, the plurality of optical fingerprint sensors 1 can also be evenly distributed in a part of the display area of the OLED display panel 600, so that a part of display area of the display module has the function of fingerprint recognition.

In the display module according to an embodiment of the present disclosure, in the optical fingerprint sensor, the first electrode is made of a light-absorbing conductive nano-material and the first electrode is patterned and includes a curved edge, and the second electrode of the switching thin film transistor is connected to curved edge of the first electrode, so that the prepared optical fingerprint sensor not only has a good light absorption rate, but also can ensure the conductivity between the photodiode and the switching thin film transistor to improve the accuracy of fingerprint recognition.

Based on the above detailed description in conjunction with the drawings and the above detailed description of the display module, a person skilled in the art should be able to understand the specific structure of the display device according to the embodiments of the present disclosure, which will not be repeated here.

The above descriptions are preferred embodiments of the present disclosure. It should be noted that a person skilled in the art would make several improvements and substitutions without departing from the principles of the present disclosure. These improvements and modifications should also be regarded as the protection scope of the present disclosure.

What is claimed is:

1. An optical fingerprint sensor, comprising a photodiode and a switching thin film transistor connected to the photodiode, wherein the photodiode comprises a first electrode made of a light-absorbing conductive nano-material;

wherein the first electrode is located in a same layer as a second electrode of the switching thin film transistor, and the first electrode comprises a light-entering end surface facing a light-entering side and a side surface connected to the light-entering end surface, the side surface comprises a curved portion, and the second electrode is at least connected to the curved portion; and wherein the second electrode is arranged to fully surround the first electrode and be connected to each position of the side surface.

2. The optical fingerprint sensor of claim 1, wherein the second electrode is a source electrode or a drain electrode of the switching thin film transistor, and the first electrode is an electrode of the photodiode away from the light-entering side.

3. The optical fingerprint sensor of claim 1, wherein the light-entering end surface is formed into a circular shape, and the curved portion is an entire side surface of the first electrode.

4. The optical fingerprint sensor of claim 1, wherein the second electrode comprises a top surface facing the light-entering side, the top surface is located in a same plane as the light-entering end surface, and the top surface and the light-entering end surface are combined to form a preset pattern.

5. The optical fingerprint sensor of claim 4, wherein the light-entering end surface is formed into a first pattern comprising a curved portion, and a portion of the top surface connected to the light-entering end surface is formed into a second pattern; and wherein the first pattern and the second pattern are combined to form a quadrilateral.

6. The optical fingerprint sensor of claim 5, wherein the first pattern of the light-entering end surface is an inverted "F" shape, the second pattern of the portion of the top surface connected to the light-entering end surface is an upright "F" shape, and the first pattern and the second pattern are spliced at the curved portion and combined to form a quadrilateral.

7. The optical fingerprint sensor of claim 1, wherein the light-absorbing conductive nano-material is an iron oxide nano-material doped with a conductive metal.

8. The optical fingerprint sensor of claim 7, wherein the conductive metal comprises, but is not limited to, one or more of titanium, platinum, molybdenum, chromium, and tin.

9. The optical fingerprint sensor of claim 1, wherein a drain electrode and a source electrode of the switching thin film transistor are made of any one of molybdenum, aluminum, chromium, gold, titanium, nickel, neodymium, copper, and an alloy thereof.

10. The optical fingerprint sensor of claim 1, wherein the second electrode is a source electrode of the switching thin film transistor, and the first electrode is a lower electrode of the photodiode.

11. The optical fingerprint sensor of claim 1, wherein the photodiode further comprises:

a PIN diode and a transparent electrode sequentially prepared on the light-entering end surface of the first electrode; and a third electrode connected to the transparent electrode.

12. The optical fingerprint sensor of claim 1, wherein the second electrode is a source electrode of the switching thin film transistor, and the first electrode is a lower electrode of the photodiode, and wherein the switching thin film transistor further comprises a gate electrode, a drain electrode, and an active layer.

13. A display module comprising the optical fingerprint sensor of claim 1.

14. The display module of claim 13, wherein the display module further comprises an organic light emitting diode (OLED) display panel; and wherein a plurality of optical fingerprint sensors is arranged on a side of the OLED display panel away from the light-entering side and distributed in an array.

15. The display module of claim 14, wherein the plurality of the optical fingerprint sensors is assembled on an optical path collimating substrate, and the optical path collimating substrate is attached to the OLED display panel.

16. The display module of claim 13, wherein the display module further comprises an organic light emitting diode (OLED) display panel, and the OLED display panel comprises a plurality of OLED pixel units; and wherein a plurality of optical fingerprint sensors is distributed in an array among the plurality of OLED pixel units.

17. The display module of claim 16, wherein the second electrode and the first electrode are arranged in a same layer as the source electrode and the drain electrode of the thin film transistor of the OLED pixel unit; and a gate electrode of the switching thin film transistor is arranged in a same layer as a gate electrode of a thin film transistor of the OLED pixel unit.

* * * * *